United States Patent [19]

Magill

[11] Patent Number: 4,635,007
[45] Date of Patent: Jan. 6, 1987

[54] SURFACE ACOUSTIC WAVE TAPPED MEANDER DELAY LINE

[75] Inventor: Edward G. Magill, Brooklyn, N.Y.

[73] Assignee: Eaton Corporation, Cleveland, Ohio

[21] Appl. No.: 725,573

[22] Filed: Apr. 22, 1985

[51] Int. Cl.[4] .............................................. H03H 9/42
[52] U.S. Cl. .................................... 333/153; 333/195; 310/313 D
[58] Field of Search ............... 333/150, 153, 154, 195, 333/193; 310/313 R, 313 B, 313 C, 313 D

[56] References Cited

U.S. PATENT DOCUMENTS

| | | | |
|---|---|---|---|
| 3,836,876 | 9/1974 | Marshall et al. | 333/195 X |
| 3,873,946 | 3/1973 | Weglein | 333/153 |
| 3,979,700 | 9/1976 | Groce | 333/150 |
| 4,037,174 | 7/1977 | Moore et al. | 333/193 |

FOREIGN PATENT DOCUMENTS 0028840   3/1977   Japan .................................. 333/150

OTHER PUBLICATIONS

"Surface Acoustic Wave Multistrip Components and Their Applications", Marshall et al, IEE Transactions on Sonics and Ultrasonics, Apr. 1983, pp. 134–144.
"Surface Acoustic Waves for RF Memory", Wang et al, Polytechnic Institute of New York, Dec. 1982.

*Primary Examiner*—Eugene R. LaRoche
*Assistant Examiner*—Benny Lee
*Attorney, Agent, or Firm*—Andrus, Sceales, Starke & Sawall

[57] ABSTRACT

A surface acoustic wave (SAW) meander type delay line (FIG. 8) is provided by a plurality of multistrip reflecting track changers (82, 84, 86, 88, 89) on a piezoelectric substrate (80) for folding back a SAW propagation path (106, 108) in serpentine manner. The meander delay line is tapped by simple RF tap means comprising single lossless coupling strips (110, 112) in the track changers removing only that portion of the SAW signal actually tapped out and converted to RF, and directly coupling out such signal portion over the entire bandwidth of the track changer. The single strips are on the center line between the arms of respective U-shaped multistrip couplers (102, 104) of the track changers. The structure enables high impedance direct RF multitap bus connection facilitating RF bus summation of many taps without a plural switching network.

7 Claims, 8 Drawing Figures

SURFACE ACOUSTIC WAVE TAPPED MEANDER DELAY LINE

BACKGROUND AND SUMMARY

The invention relates to surface acoustic wave (SAW) delay lines, and particularly provides a simple tapped meander delay line.

Rectilinear SAW delay lines are known, for example as shown at 2 in FIG. 1, "Surface Acoustic Wave Multistrip Components and Their Applications", Marshall et al, IEEE Transactions On Sonics and Ultrasonics, April 1983, pages 134-144, at FIG. 4. A SAW is propagated along path 4 on piezoelectric substrate 6. A plurality of multistrip couplers such as 8-11, each of which is an array of parallel metallic strips deposited on the piezoelectric substrate, transfer acoustic power from one acoustic track or path such as 4 to another such as 5. A multifinger RF interdigital transducer 12 is formed by an array of alternately interconnected parallel metallic strips deposited on the piezoelectric substrate, and transduces an RF signal to an acoustic signal or SAW. The leftward propagation of the SAW from transducer 12 is terminated by absorber 14. The rightward propagation of the SAW from transducer 12 is coupled by multistrip coupler 8 such that a portion of the SAW continues along path 4 and a portion is transferred to upper parallel path 5, the leftward propagation of which is terminated by the upper portion of absorber 14, and the rightward propagation of which is converted to an RF signal by multifinger RF interdigital transducer 16. Absorber 18 terminates rightward SAW propagation from transducer 16. Like operation is provided by multifinger RF interdigital transducer 20 and absorber 22, RF transducer 24 and absorber 26 and so on. This is a multitapped delay line with different length delays of the RF signals from transducers 16, 20, 24 and so on.

The total delay time in the structure of FIG. 1 is limited by the length of the rectilinear SAW track. Overcoming this limitation is another known SAW delay line, as shown in FIG. 2, which is folded back in serpentine manner to provide a meander type delay line, "Surface Acoustic Waves for RF Memory", Wang et al, Polytechnic Institute of New York, December 1982. Multifinger RF interdigital transducers 30 and 32 provide input and output ports for an RF signal which is transduced to a SAW propagating back and forth between reflecting multistrip couplers 34, 36, 38 and so on. This meander type delay line is limited to a single delay time between input 30 and output 32, without plural selective delay times as in the tapped delay line of FIG. 1.

The present invention combines the advantages of the tapped delay line of FIG. 1 and the meander type delay line of FIG. 2. The present invention provides a tapped meander delay line.

Much work has been done on multistrip components to perform various functions, Marshall et al, supra. As shown in FIG. 3, a SAW from RF transducer 40 can have its propagation path altered by multistrip coupler 42, for example a 90° change in direction. The U-shaped multistrip couplers such as 44 in FIG. 4 have been used as reflecting elements for returning the SAW back to RF transducers such as 46 and 48.

U-shaped reflectors such as 44 have been combined with straight multistrip couplers to provide a reflecting track changer 50, FIG. 5, which may be used as the reflectors such as 34 in FIG. 2. Reflecting track changer 50 includes a 3 dB straight multistrip coupler 52 and a pair of U-shaped multistrip couplers 54 and 56 facing each other at the ends of the arms of the U's.

As noted on page 138 in the above noted Marshall et al article, a unidirectional transducer may be constructed by combining a multifinger RF interdigital transducer such as 60, FIG. 6, with a U-shaped multistrip coupler 62. Interdigital transducer 60 is provided with an odd number of fingers and is placed within the arms 62a and 62b of the U so that the center of the central finger 60a is offset, relative to the center line of U 62, by ⅛ wavelength towards the desired output port. This in turn eliminates the need for absorbers to terminate a SAW otherwise propagating in the other direction. The structure is inherently frequency band limited to the ⅛ wavelength offset.

In another application of angled couplers, the U-shaped structure can be formed into a J, as shown at 70, FIG. 7, by extending one arm of the U at 72 into an adjacent track 74. In conjunction with a bidirectional RF transducer 76, the J forms a unidirectional transducer and tap. Without transducer 76, it acts as a reflector.

SUMMARY

The present invention evolved during development efforts on improvements in meander type delay lines, as in FIG. 2, using reflecting track changers such as 50, FIG. 5. The invention arose from the discovery that the field and signal between the upper and lower U's 54 and 56 is so balanced that simple output taps form a balanced inphase coupling in the center of the U's. It was then recognized that a simple tap will couple signals out, and will do so over the full bandwidth of the track changer itself. This has surprisingly gone unrecognized in the art.

The simple tap is formed by a single metallized strip on the center line between the arms of each of the U's, and connection strips are brought out from between the facing ends of the U arms. The structure is particularly simple and efficient. The single strip provides a lossless coupling removing only that portion of the SAW signal actually tapped out. There is no generation of spurious SAW signals otherwise lost or requiring absorption. There is no frequency bandwidth limitation beyond the track changer itself.

The invention further affords a multitap structure enabling high impedance direct RF multitap bus connection suitable for RF bus summation of many taps without a complex plural switching network.

BRIEF DESCRIPTION OF THE DRAWINGS

Prior Art

Present Invention

Figure 1:
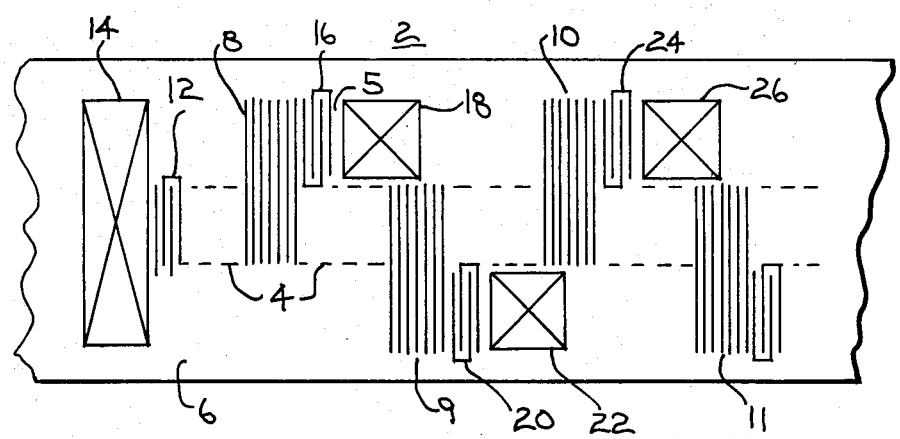
FIG. 1 shows a known rectilinear tapped delay line.
Figure 2:
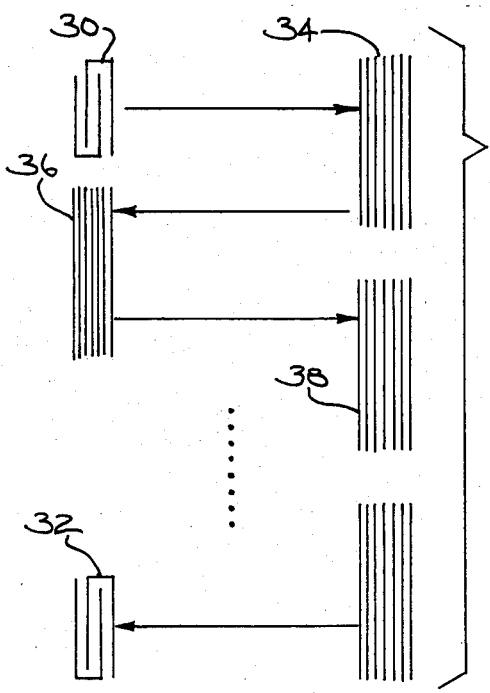
FIG. 2 shows a known meander or serpentine folded back type delay line.
Figure 3:
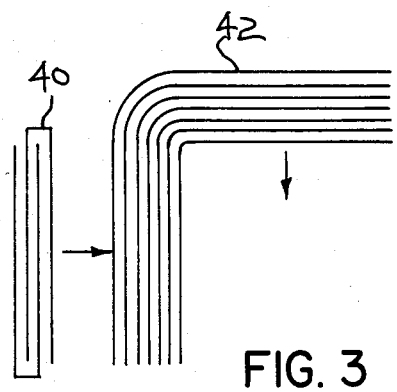
FIG. 3 shows a multistrip coupler component.
Figure 4:
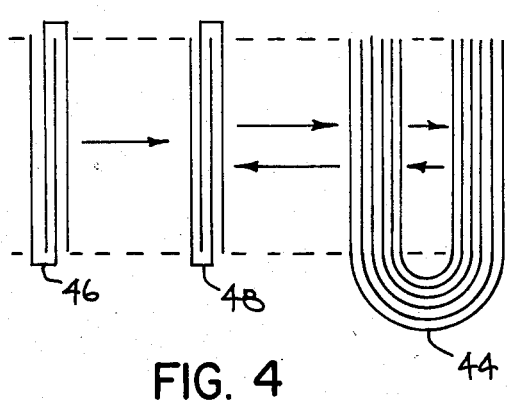
FIG. 4 shows a U-shaped reflecting multistrip coupler component.
Figure 5:
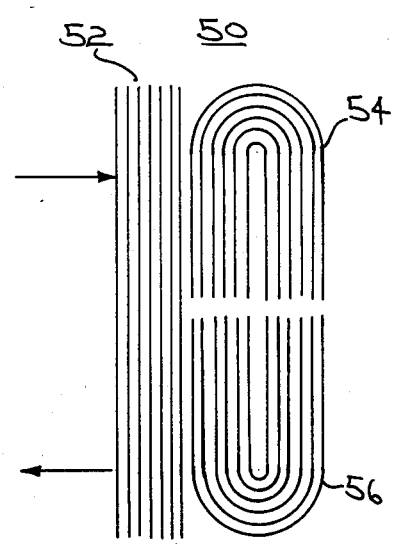
FIG. 5 shows a reflecting track changer.
Figure 6:
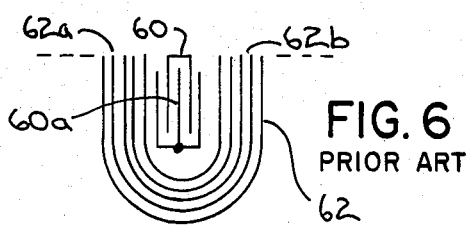
FIG. 6 shows a unidirectional transducer formed by a U-shaped multistrip coupler together with a multifinger RF interdigital transducer.
Figure 7:
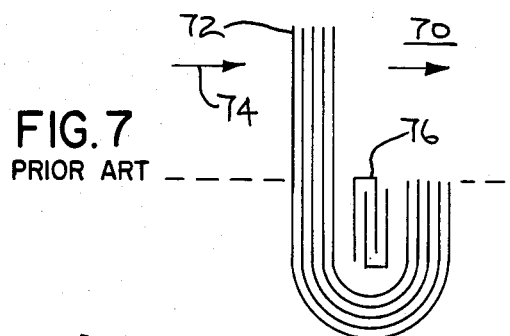
FIG. 7 shows a J-shaped delay line tap.
Figure 8:
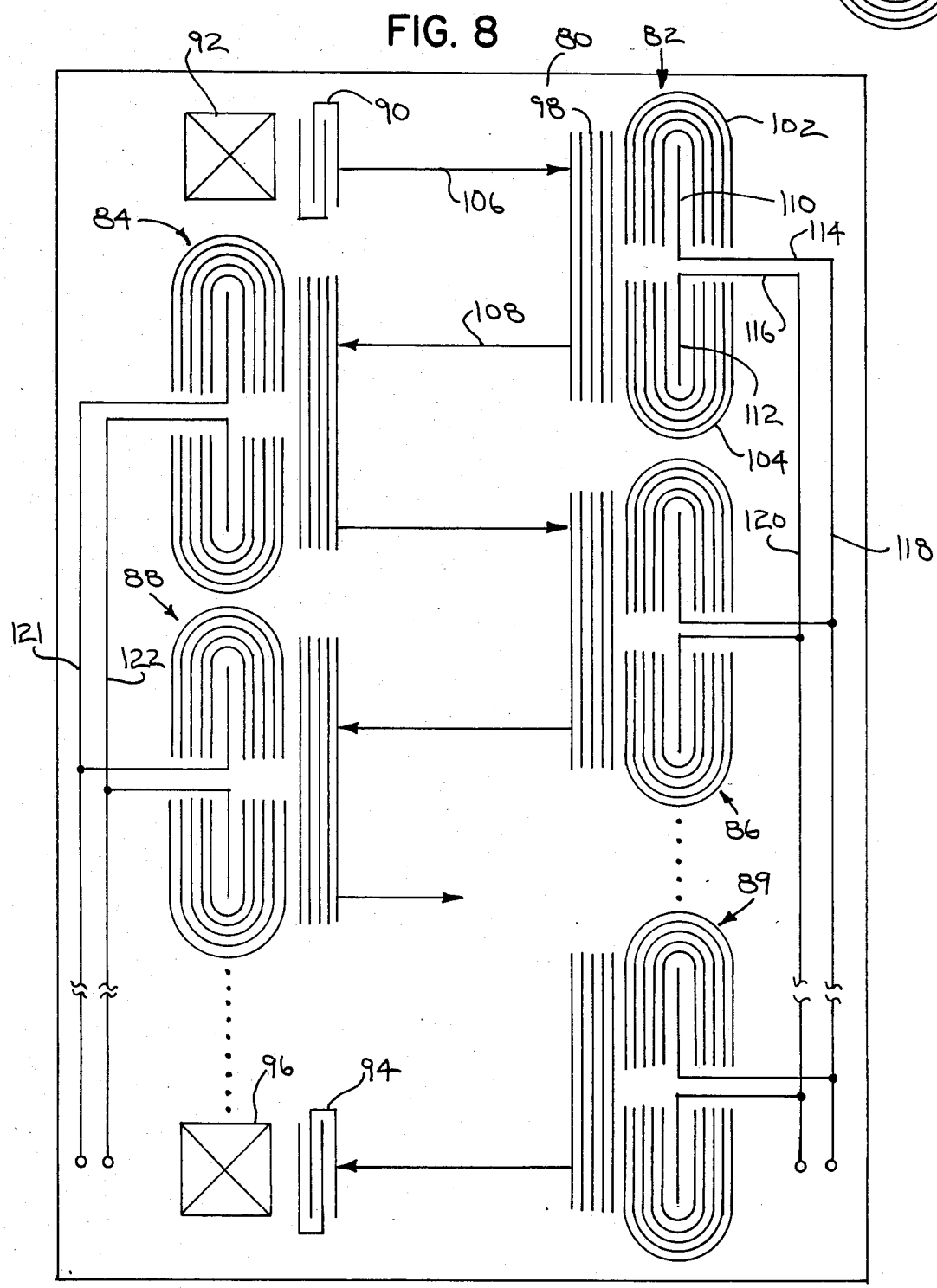

FIG. 8 shows a tapped SAW meander delay line in accordance with the invention.

DESCRIPTION OF THE INVENTION

FIG. 8 shows a piezoelectric substrate 80 having a plurality of multistrip reflecting track changers 82, 84, 86, 88, 89 and so on formed thereon for folding back a SAW propagation path in serpentine manner to provide a meander type delay line. An input port is provided by multifinger RF interdigital transducer 90 launching a SAW rightwardly to track changer 82. The leftward propagated SAW from transducer 90 is terminated by absorber 92. An output port is provided at multifinger RF interdigital transducer 94 which converts the SAW signal received from track changer 89 to RF. The continued leftward propagated SAW is terminated by absorber 96.

Track changer 82 includes a 3 dB straight multistrip coupler 98 formed by an array of parallel metallic strips on substrate 80. The track changer further includes first and second U-shaped multistrip couplers 102 and 104, each of which comprises an array of parallel U-shaped metallic strips adjacent coupler 98 and coupling therewith on the opposite side thereof from the SAW propagation paths such as 106 and 108. The U-shaped multistrip couplers 102 and 104 face each other in spaced relation at the ends of the arms of the U's.

A first single metallic strip 110 is formed on the substrate on the center line between the arms of U 102, and provides a simple tap. A second single metallic strip 112 is formed on the substrate in the second U-shaped coupler 104 on the center line between the arms of U 104. Metallic connection strips 114 and 116 are formed on the substrate and extend from respective taps 110 and 112 between the facing ends of the U arms and externally of the U-shaped couplers to an RF bus provided by metallic strips 118 and 120 formed on the substrate.

The combined track changer and integral simple tap structure is comparable for track changers 84, 86, 88, 89 and so on. This provides a multitap and reflecting track changer structure affording multiple delay taps. Each tap provides a high impedance direct tap to the bus such as 118, 120, which in turn facilitates RF bus summation of many taps without a complex plural switching network or the like otherwise needed for low impedance matched bus termination. RF bus 121, 122 is comparable.

The field and signal between the upper and lower U's 102 and 104 is so balanced and inphase that simple direct output taps forms a balanced inphase coupling in the center of the U's, and the simple tap couples the signal out and does so over the full bandwidth of track changer 82.

The RF tap afforded by 110, 112 provides a lossless but loose coupling removing only that portion of the SAW signal actually tapped out and converted to RF. The tapped out portion of the SAW signal is directly coupled out from the track changer to the bus over the entire bandwidth of the track changer. It is preferred that the tapped out field be balanced between conductors 114 and 116, though strips 110 and 112 may be joined and connected by a single output conductor replacing 114 and 116 and referenced to a ground plane of the substrate.

It is recognized that various alternatives and modifications are possible within the scope of the appended claims.

I claim:

1. In a surface acoustic wave, SAW, delay line having input signal transducer means and transducing an input RF signal to a SAW signal, said delay line being formed by one or more track changers which reflect said SAW in folded back serpentine manner to provide a meander type delay line, the improvement comprising RF tap means disposed within at least one of said track changers for tapping a signal from said line, wherein said RF tap means comprises conductive strip lossless coupling means removing a portion of said SAW signal without transducer means and without generation of spurious SAW signals otherwise requiring absorption, and comprising output signal transducer means transducing said SAW signal to an output RF signal, said input and output signal transducer means establishing the bandwidth of said delay line, and wherein said portion of said SAW signal removed by said RF tap means conductive strip lossless coupling means is removed over the entire bandwidth of said delay line established by said input and output signal transducer means.

2. A surface acoustic wave, SAW, meander type delay line, comprising:

a substrate;

input transducer means arranged on said substrate and transducing an input RF signal to a SAW signal;

output signal transducer means arranged on said substrate and transducing said SAW signal to an output RF signal;

a plurality of RF tapped track changers arranged on said substrate between said input and output transducer means such that said track changers are receiving and reflecting said SAW signal in a folded back serpentine manner to provide said meander type delay line, a first of said RF tapped track changers receiving said SAW signal from said input signal transducer means along a first propagation path and reflecting said SAW signal in a folded back manner along a second propagation path substantially parallel and in the opposite direction to said first path, a second of said RF tapped track changers receiving said SAW signal from said first RF tapped track changer along said second path and reflecting said SAW signal in a folded back manner along a third propagation path substantially parallel and in the opposite direction to said second path, and so on, the last of said RF tapped track changers reflecting said SAW signal to said output signal transducer means;

each said RF tapped track changer comprising:

a straight multistrip coupler having one and another distally opposite sides, comprising an array of parallel metallic strips, for reflecting an incident SAW signal on said one side back along an opposite-going parallel propagation path;

a first U-shaped multistrip coupler, comprising an array of parallel U-shaped metallic strips, adjacent said straight multistrip coupler and coupling therewith on said other side thereof opposite from said SAW propagation paths;

a second U-shaped multistrip coupler, comprising an array of parallel U-shaped metallic strips, adjacent said straight multistrip coupler and coupling therewith on said other side thereof opposite from said SAW propagation paths, said U-shaped multistrip couplers facing each other in spaced relation at the ends of the arms of the U's with a gap therebetween;

a first single metallic strip disposed in said first U-shaped multistrip coupler along the center line between the arms of the U;

a second single metallic strip disposed in said second U-shaped multistrip coupler along the center line between the arms of the U; and connection means connected to said first and second single metallic strips and extending out of said U-shaped couplers through said gap therebetween and away from said straight multistrip coupler.

3. The invention according to claim 4 comprising RF bus means directly connected to said connection means, said first and second single strips providing a loose coupling high impedance lossless direct RF tap bus connection enabling RF bus summation of a plurality of said tapped track changers without a plural switching network, and removing only that portion of the SAW signal in said tapped track changer converted to RF.

4. In a surface acoustic wave, SAW, delay line having input signal transducer means transducing an input RF signal to a SAW signal and having a plurality of propagation paths folded back on one another in a spaced parallel manner, the improvement comprising a plurality of trach changers each comprising a combined reflecting track changer and RF tap for converting said SAW signal to RF and comprising a pair of U-shaped multistrip couplers facing each other in spaced relation at the ends of the arms of the U's, and first and second single conductive strips, one strip respectively disposed in each of said couplers along the center line between the arms of the respective U, thereby providing a loose lossless RF tap removing only that portion of the SAW signal in the track changer actually converted to RF, without generation of the spurious SAW signals.

5. The invention according to claim 4 wherein:

said ends of said arms of said U's face each other and are spaced by a gap therebetween, said gap extending along an axis substantially perpendicular to said center line of said U's;

said first and second single strips in said U's extend toward each other along said center line and beyond said ends of said arms of the respective said U and into said gap, said first and second single strips having ends within said gap and facing each other and spaced by a second gap within and narrower than said first mentioned gap;

and comprising first and second connector strips extending from the facing ends of respective said first and second single strips and extending out of the U's along said second gap perpendicularly to said center line of the U's and within said first gap and spaced from said ends of said arms of the U's to provide a balanced RF output and connected to an RF bus to provide high impedance direct RF bus connection.

6. High impedance direct RF multitap bus and reflecting track changer structure for folding a surface acoustic wave, SAW, propagation path in serpentine manner with a plurality of opposite-going parallel paths to provide multiple delay taps, and subject to loss only for that portion of the SAW actually tapped out, comprising:

a piezoelectric substrate;

bus means on said substrate;

a plurality of reflecting track changers each comprising a 3 dB straight multistrip coupler on said substrate receiving said SAW and reflecting said SAW in folded back serpentine manner along an opposite-going parallel path to provide a meander type delay line, each said track changer also comprising first and second U-shaped multistrip couplers on said substrate associated with and adjacent said straight coupler and coupling therewith, said U-shaped multistrip couplers facing each other in spaced relation at the ends of the arms of the U's;

a plurality of taps each comprising first and second single metallized strips on said substrate in each said track changer along the center line between the arms of the respective said first and second U-shaped couplers;

said ends of said arms of said U's facing each other and spaced by a gap therebetween, said gap extending along an axis substantially perpendicular to said center line of said U's, said first and second single strips in said U's extending toward each other along said center line and beyond said ends of said arms of the respective said U and into said gap, said first and second single strips having ends within said gap and facing each other and spaced by a second gap within and narrower than said first mentioned gap; and connection means on said substrate extending along said second gap perpendicularly to said center line of the U's and within said first gap and spaced from said ends of said arms of the U's and connecting said first and second single strips to said bus means.

7. The invention according to claim 6 wherein said connection means comprises first and second connecting strips on said substrate extending from the facing ends of respective said first and second single strips to said bus means to provide a lossless balanced RF direct high impedance output to said bus means.

* * * * *